US012348239B2

(12) United States Patent
Liu et al.

(10) Patent No.: US 12,348,239 B2
(45) Date of Patent: Jul. 1, 2025

(54) SPLIT-DITHERING SCHEME IN SUCCESSIVE APPROXIMATION ANALOG TO DIGITAL CONVERTER

(71) Applicant: Avago Technologies International Sales Pte. Limited, Singapore (SG)

(72) Inventors: Yong Liu, Irvine, CA (US); Wei Zhang, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 252 days.

(21) Appl. No.: 18/127,508

(22) Filed: Mar. 28, 2023

(65) Prior Publication Data

US 2024/0333296 A1    Oct. 3, 2024

(51) Int. Cl.
  *H03M 1/20* (2006.01)
  *H03M 1/06* (2006.01)
  *H03M 1/08* (2006.01)
  *H03M 1/18* (2006.01)
  *H03M 1/46* (2006.01)

(52) U.S. Cl.
  CPC ......... *H03M 1/201* (2013.01); *H03M 1/0641* (2013.01); *H03M 1/08* (2013.01); *H03M 1/185* (2013.01); *H03M 1/462* (2013.01); *H03M 1/468* (2013.01); *H03M 1/46* (2013.01)

(58) Field of Classification Search
  CPC ...... H03M 1/201; H03M 1/185; H03M 1/462; H03M 1/46; H03M 1/0641; H03M 1/468; H03M 1/08
  USPC .................................................. 341/131, 155
  See application file for complete search history.

(56) References Cited

U.S. PATENT DOCUMENTS

| 6,768,437 | B1 | 7/2004 | Ruotsalainen et al. |
| 9,667,267 | B2 * | 5/2017 | Wang ..................... H03M 1/201 |
| 10,790,850 | B1 * | 9/2020 | Lin ......................... H03M 3/33 |

FOREIGN PATENT DOCUMENTS

| EP | 1 248 374 A2 | 10/2002 |
| EP | 3 758 236 A1 | 12/2020 |

OTHER PUBLICATIONS

Foreign Search Report on non-Foley case related to U.S. Appl. No. 18/127,508 dtd Sep. 3, 2024.

* cited by examiner

*Primary Examiner* — Khai M Nguyen
(74) *Attorney, Agent, or Firm* — Foley & Lardner LLP (57) ABSTRACT

A system includes a dither generator module that includes a most significant bits (MSB) dither generator device that generates a first random value. The dither generator module also includes a least significant bits (LSB) dither generator device that generates a second random value. The system further includes a first digital to analog converter (DAC) that receives a sum of the first random value and the second random value and generates a dither signal based on the sum of the first random value and the second random value. The system also includes an analog to digital converter (ADC) that receives a sum of the dither signal and a sampled input signal and generates a first digitized signal. The system includes a subtraction module that subtracts the sum of the first random value and the second random value from the first digitized signal to produce a digitized output signal.

20 Claims, 9 Drawing Sheets

FIG. 4C

SPLIT-DITHERING SCHEME IN SUCCESSIVE APPROXIMATION ANALOG TO DIGITAL CONVERTER

TECHNICAL FIELD

The present description relates generally to analog to digital converters and, in particular, using dithering in analog to digital converters.

BACKGROUND

A high performance and high resolution analog to digital converter (ADC) may be needed to, for instance, capture and convert radio frequency (RF) signals to digital signals. A successive approximation analog to digital converter (SAR ADC) with complementary metal-oxide semiconductor (CMOS) technology has low power and compact area and paves the way for low-power and high-performance 5G wireless base stations, using multiple SAR ADCs, with a sampling frequency of tens of Gigahertz (GHz).

BRIEF DESCRIPTION OF THE DRAWINGS

Certain features of the subject technology are set forth in the appended claims.

However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have additional intervening elements or components and additional intervening processes present between the illustrated components/processes. Also, the embodiments described herein may include additional intervening elements and additional intervening processes between the illustrated components/processes/etc. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

For narrow-band data communication systems, e.g., wireless systems, high-performance and high-resolution ADC is needed to capture and convert the radio frequency (RF) signal to digital signals. With CMOS technology scaling, SAR ADC is used because of low power usage and minimal area requirements on the substrate (e.g., circuit board, integrated circuit, or other supporting material upon which or within which the elements of a semiconductor device are fabricated or attached). Time-interleaved SAR ADC may be implemented to achieve very high sampling frequencies, e.g., tens of GHz. The RF direct sampling receiver provides for low-power and high-performance wireless base stations.

The mismatch between the SAR ADCs causes harmonic spurs in the overall time-interleaved ADC output spectrum. The SAR ADC may include a digital to analog converter (DAC). Although the DAC may be calibrated, the residual DAC calibration errors may not meet the required spurious-free dynamic range (SFDR) specification. Added dithering may be applied to the SAR ADC to smooth the nonlinearity error so that the ADC harmonic spurs are reduced. A technique for applying dithering described herein uses a split dithering approach in which two different modules generate two different dither signals, e.g., a first dithering signal and a second dithering signal, to be added to the input signal. The first dithering signal has lower random values, e.g., positive or negative integer values with smaller magnitudes compared to magnitudes of the values of the second dithering signal. The second dithering signal has higher random values, e.g., positive or negative integer values with larger magnitudes compared to the magnitudes of the values of the first dithering signal. In some embodiments, both the first dithering signal and the second dithering signal is added to the input signal of the SAR ADC. In some embodiments, only one of the first dithering signal or the second dithering signal is applied to the input signal before the DAC. In some embodiments, the first dithering signal has lower random values with magnitudes that have non-zero bits in the least significant bits (LSB) segment and no non-zero bits in the most significant bits (MSB) segment, when the magnitude of the first dithering signal is presented in binary form. In some embodiments, as described below, the second dithering signal have higher random values with magnitudes that have non-zero bits in the MSB segment and no non-zero bits in the LSB segment, when the magnitude of the second dithering signal is presented in binary form. In some embodiments, the magnitude of a number is the absolute value of the number.

In some embodiments, the SAR dither range is determined based on the sensitive input signal range and the DAC middle bits mismatch characteristics. Since the dithering signal is added in the analog domain, the available input signal range is reduced by the maximum dither range. The required minimum dither step, of the first dithering signal, is determined by the DAC low bits mismatch characteristics. Using a single dithering signal to cover both the required dither range and provide the minimum dither step may suffer unnecessary input signal dynamic range reduction and may need extra dithering power. Therefore, the technique of using two dither signals (e.g., two independent signals), one with larger magnitudes and the other one with smaller magnitudes, may prevent unnecessary input signal dynamic range reduction and may not require applying extra dithering power. The subject technology may be implemented in systems, such as wireless base stations with 5G New Radio (NR) protocol (as a non-limiting example), to improve SFDR due to SAR non-linear errors. In some embodiments, a component, a circuit, a device, or a module that converts a digital signal to an analog signal is a DAC. In some embodiments, a component, a circuit, a device, or a module that converts an analog signal to a digital signal is an ADC.

Figure 1A:
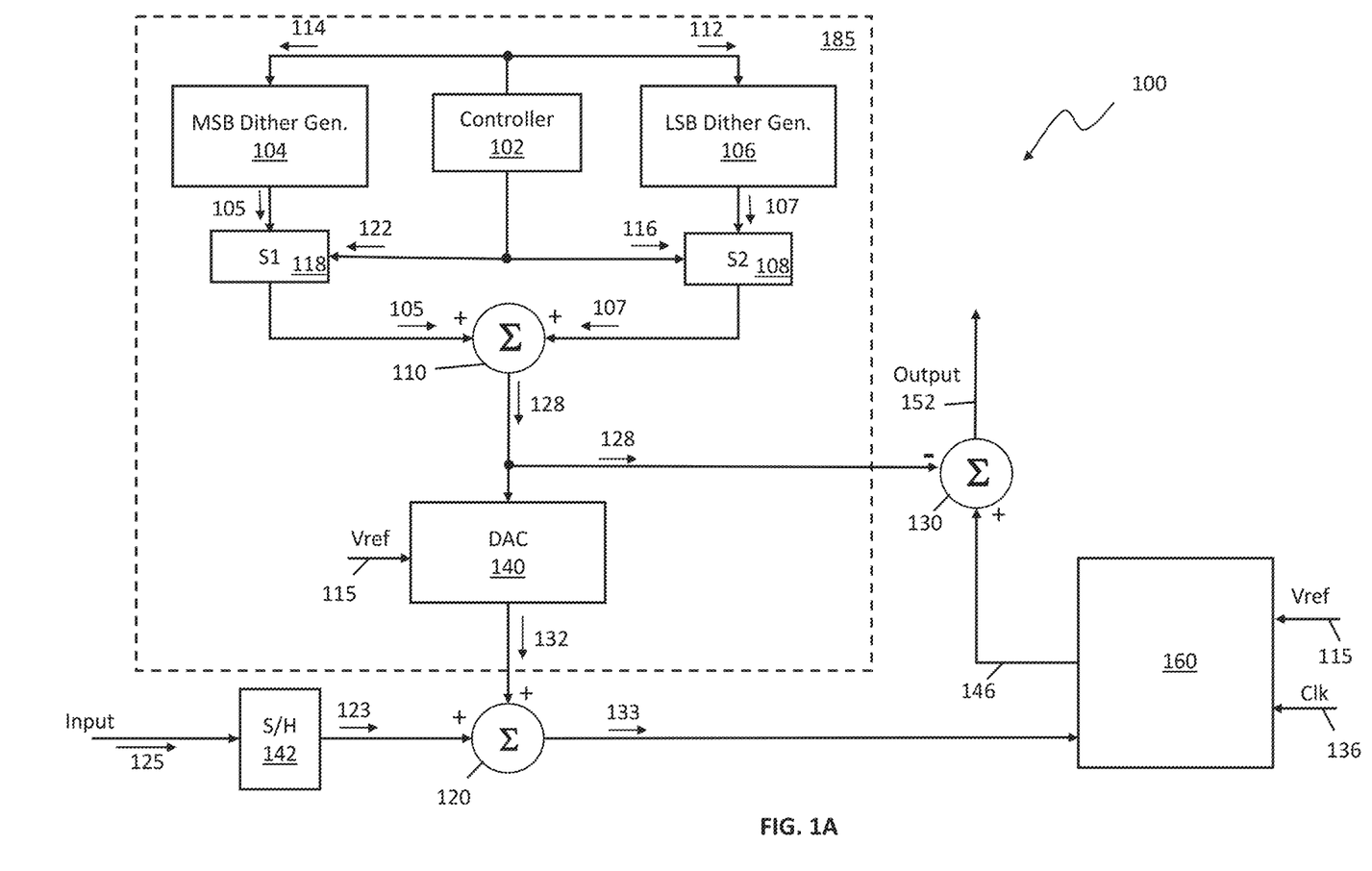
FIGS. 1A and 1B illustrate ADC systems, according to various aspects of the subject technology.
Figure 1B:
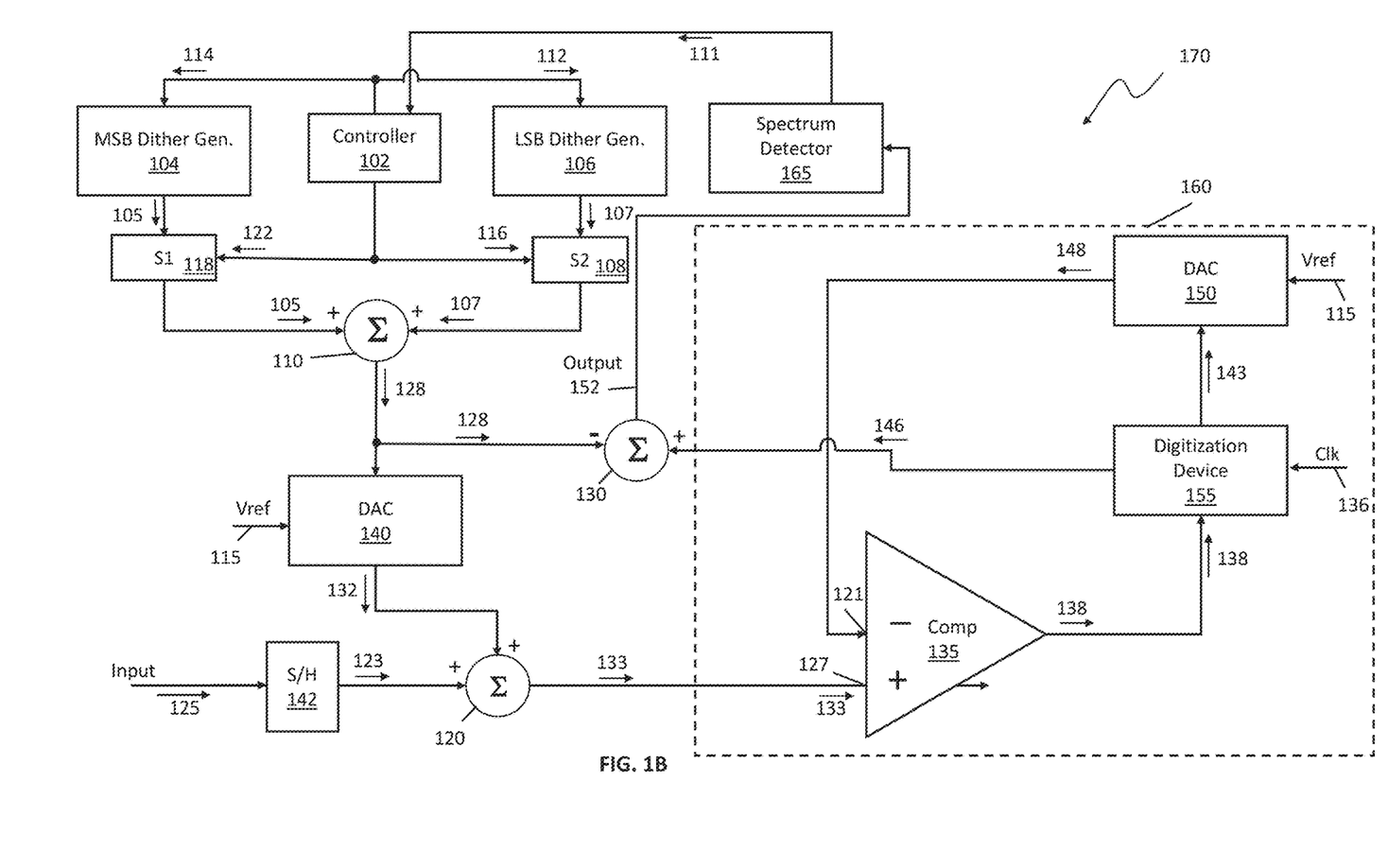

FIGS. 1A and 1B illustrate ADC systems 100 and 170, according to various aspects of the subject technology. The ADC system 100 of FIG. 1A includes a dither generator module 185 that includes an MSB dither generator device 104 and an LSB dither generator device 106 that both are coupled and controlled by a controller 102 using command signals 114 and 112, respectively. In some embodiments, a command signal includes one or more instruction for the recipient of the command signal to perform one or more tasks. The LSB dither generator device 106 produces a random value 107, e.g., a random value, which has a magnitude that occupies only the LSB bits. In some embodiments, the LSB dither generator device 106 produces the random values −14, −10, −6, −2, +2, +6, +10, +14, e.g., integer random values, e.g., random values that are integers, having magnitudes that occupies only the first 4 bits, e.g., the four least significant bits zero to three. Also, the random values generated by the LSB dither generator device 106 include only non-zero bits in the four least significant bits. The MSB dither generator device 104 produces a random value 105, e.g., a random value, which has a magnitude that occupies above the LSB bits. In some embodiments, the MSB dither generator device 104 produces the random values −56, −40, −24, −8, +8, +24, +40, +56, e.g., integer random values, having magnitudes with non-zero bits that occupy only after the first three least significant bits (e.g., after bit number two). In some embodiments, the bits above the LSB segment are part of the MSB segment. In some embodiments, each one of the LSB dither generator device 106 or the MSB dither generator device 104 includes a processor (not shown) and random generator applications running on the processors generate the random values. In some embodiments, the random values are not deterministic. In some embodiments, each one of the LSB dither generator device 106 or the MSB dither generator device 104 includes a circuit that determines the random values based on a physical random signal, e.g., based on a current produced by thermal noise of a resistor of the circuit. In some embodiments, a single circuit is used to produce the random values of both the LSB dither generator device 106 and the MSB dither generator device 104.

In some embodiments, the MSB dither generator device 104 produces dither values that have only non-zero bits in the bit number 3 to bit number 5 and have zero values in the bits 0-2, e.g., the non-zero bits are limited to bit number 3 to bit number 5. Thus, the MSB segment is bit number 3 to bit number 5 and the LSB segment is bits 0 to 3 and, thus, the MSB segment and the LSB segment overlap in one bit, which is the bit number 3. Thus, the non-zero bits of the magnitudes of the integer values generated by the MSB dither generator device 104 are limited to the MSB segment. Also, the non-zero bits of integer values generated by the LSB dither generator device 106 are limited to the LSB segment. In some embodiments, the MSB dither generator device 104 produces random values between −60 and +60 but does not produce any random value with non-zero value in bits 0 and 1. In some embodiments, the LSB dither generator device 106 produces random values between −7 and +7 and produces random values with magnitudes having non-zero values in bits 0 to 2. Thus, the MSB segment is bit number 2 to bit number 5 and the LSB segment is bits 0 to 2 and, thus, the MSB segment and the LSB segment overlap in one bit, which is the bit number 2. In some embodiments, the MSB dither generator device 104 produces dither values with magnitudes that have only non-zero bits in the MSB segment, and the LSB dither generator device 106 produces dither values with magnitudes that has only non-zero bits in the LSB segment. In some embodiments, the MSB segment has a first number of bits between 3 to 8 and the LSB segment has a second number of bits between 2 and 6. In some embodiments, the first number of bits includes the upper half and the second number of bits includes the lower half of a bit range of the ADC system 100 or ADC system 170. In some embodiments, if the bit range has 2k bits, the lower half of the bit range is bits zero to k−1 and the upper half of the bit range is bit k to bit 2k−1 and each bit in the lower half or upper half are either zero or one. In some embodiments, each lower half bit has a lower positional value compared to a positional value of each upper half bit.

In some embodiments, the bit range is 12 bits, e.g., bits zero to eleven. In some embodiments, the MSB segment is an upper half, e.g., the upper 6 bits, bits 6 to 11, of the bit range of the ADC system 100. In some embodiments, the LSB segment is a lower half, e.g., the lower 6 bits, bits 0 to 5, of the bit range of the ADC system 100. In some embodiments, the LSB segment is bits zero to 3 and the MSB segment is bits 4 to 11. In some embodiments, the MSB segment includes only four bits of the upper half of the bit range and the LSB segment includes only three bits of the lower half of the bit range. In some embodiments, the bit range has either 24 or 48 bits and the MSB segment includes the upper half of the bit range.

In some embodiments, the controller 102 controls, e.g., designates, the number of most significant bits, the number of least significant bits, and whether they overlap or do not overlap (e.g., the overlap is null). Thus, the controller 102 can modify the magnitude of the dither value of the LSB dither generator device 106 and the dither value of the MSB dither generator device 104 using command signals 114 and 112. The dither values can be both positive and negative. However, the magnitude of the dither value fits either in the MSB segment or the LSB segment, or both when the MSB segment and the LSB segment overlap. The ADC system 100 also includes switches 108 and 118 (shown as S2 and S1) that are controlled by the controller 102 such that the controller 102 may close or open the switches independent of each other. As shown, the random value 107 goes through the switch 108 to an adder module 110, e.g., an algebraic sum module. Also, the random value 105 goes through the switch 118 to an adder module 110 and the adder module 110 produces a dither sum value 128. Also, the dither sum value 128 is a digital dither signal because the random values 105 and 107 are digital signals. In some embodiments, the MSB segment is the upper half or upper 7/12 of the bit range and the LSB segment is the lower half of the bit range. In some embodiments, the MSB segment and the LSB segment do not coincide with precise upper and lower halves of the bit range but that the MSB segment covers a higher range of bits compared to the LSB segment.

In some embodiments, the controller 102 commands both switches 108 and 118 to close and, thus, the sum signal is equal to the sum of the random value 105 and the random value 107. In some embodiments, the controller 102 commands the switch 108 to close and the switch 118 to open and, thus, the dither sum value 128 is equal to the random value 107. In some embodiments, the controller 102 commands the switch 108 to open and the switch 118, via commend signals 122 and 116, to close and, thus, the dither sum value 128 is equal to the random value 105.

As noted above the random values 105 and 107 are random numbers, e.g., random digital signals. Thus, the dither sum value 128 is also a random number, e.g., a random digital signal. The dither sum value 128 is sent to a digital to analog converter (DAC) 140, to produce an output that is a dither sum signal 132, e.g., an analog signal representing the dither sum value 128. The DAC 140 also receives a reference voltage 115 and generates the dither sum signal 132, e.g., the dither signal, based on the reference voltage 115. The ADC systems 100 further includes a sample and hold (S/H) module 142 that receives the input signal 125, samples and then holds the input signal 125, and produces a sampled input signal 123, e.g., the samples of the input signal 125. As shown, an adder module 120 receives the dither sum signal 132 as well as the sampled input signal 123, e.g., a sampled voltage. At the output of the adder module 120 a sum of the sampled input signal 123 and the dither sum signal 132 is produced, which is a sampled input plus dither signal 133, e.g., a modified input signal. In some embodiments, the sampled input plus dither signal 133 is digitized by the ADC system 100. In some embodiments, the bit range of the ADC system 100 is the same as a bit range, e.g., a number of input bits, of the DAC 140.

In some embodiments, the sampled input signal 123 is a sequence of rectangular pulses each having a fixed duration T and a height that is the sampled value of the input signal 125. In some embodiments, the dither sum value 128 is a sequence of random numbers, e.g., random value, which vary in time. Also, in some embodiments, the dither sum signal 132 is a sequence of rectangular pulses such that the height of the pulses are the random values of the dither sum value 128 and each pulse extends for the duration T, which T is the sampling period of the sample and hold (S/H) module 142. Thus, in some embodiments, the dither sum signal 132 is a collection of attached pulses each having the duration T and the height of the pulses are the random values. The dither sum signal 132 is added to the sampled input signal 123 to generate the input plus dither signal 133. Therefore, for each duration T, a random value is generated and a rectangular pulse having the duration T and the generated random value as the height is added to the pulse of the sampled input signal 123. Thus, for each duration T, the dither sum value 128 is generated and the dither sum value 128 is added to the height of the pulses of the sampled input signal 123 to generate the input plus dither signal 133.

As shown in FIG. 1A, the input plus dither signal 133 is sent to an ADC module 160 to be converted to a digital output. As shown, the ADC module 160 produces a first digitized signal 146, which is a digital representation of the input plus dither signal 133 that is sent to a subtraction module 130, e.g., an algebraic sum module, which either receives two values and determines a difference of the two values, or receives two signals and determines another signal which is the difference of the two signals. In some embodiments, the subtraction module 130 subtracts the dither sum value 128 from the first digitized signal 146 and produce an output signal 152, e.g., a digitized output signal, which is a digital representation of the input signal 125 of the ADC system 100. Thus, the dither sum value 128 that was originally added to the input signal 125 is subtracted from the first digitized signal 146, e.g., signal values, to produce the output signal 152, e.g., output values, which is the input signal in digitized form. In some embodiments, adding the dither sum signal 132 helps reduce the non-random distortions such as non-linearity of the ADC.

The ADC system 170 of FIG. 1B is consistent with the ADC system of 100 of FIG. 1A with the difference that the ADC system 170 includes a spectrum detector 165 that is connected to the output signal 152. In addition, FIG. 1B shows the components of the ADC module 160 that include a comparator module 135. In some embodiments, as shown, the comparator module 135 has a non-inverting node 127 and an inverting node 121. A comparison signal 138 at an output of the comparator module 135 is a subtraction result of a first signal coupled to the inverting node 121 from a second signal coupled to the non-inverting node 127. The input plus dither signal 133 is sent to a non-inverting node 127 of the comparator module 135. The comparator module 135 also receive an initial estimate, e.g., an initial approximation, of the input plus dither signal 133 as a signal 148 through an inverting node 121. In some embodiments, the comparator module 135 determines a difference signal, which is the signal coupled to the non-inverting node 127 minus the signal coupled to the inverting node 121. The comparator module 135 compares the two input signals, e.g., the signal 148 and the input plus dither signal 133 and generates the comparison signal 138. In some embodiments, the comparison signal 138 is a difference between the input plus dither signal 133 and the signal 148. When the comparison signal 138 is positive, indicates that the input plus dither signal 133 is larger than the signal 148, e.g., the estimate, and when the comparison signal 138 is negative, indicates that the input plus dither signal 133 is smaller than the initial estimate. When the comparison signal 138 is within a predefined, e.g., predetermined, range, the signal 148, e.g., the estimated signal is acceptable and the iterative method of digitizing the sample of the input plus dither signal 133 is complete and may end and the next sample may be acquired, dither value added, and then digitized. However, when the comparison signal 138 is not within the predefined range, the estimated signal is not acceptable and the iterative method of digitizing the sample of the input plus dither signal 133 is not complete. Thus, generating the next estimate of the first digitized signal continues until the comparison signal is within the predefined range.

In some embodiments, the input plus dither signal 133 is digitized by the ADC module 160 and the first digitized signal 146 is generated using an iterative method. In some embodiments, the sampling frequency is between five and ten times slower than a clock signal 136 (Clk) that is coupled to a digitization device 155. In some embodiments, the digitization device 155 can be any hardware, software, or the combination of the two used for performing the successive approximations for producing a digitized signal. Thus, during each sampling period, the sampled input plus dither signal 133 is converted into a digital value and the iterations for successive approximation are performed during the sampling period. The digital value of the sampled input plus dither signal 133 may be determined before the sampling period ends and subsequently, next input plus dither signal 133 is sampled and then the digital value is determined.

As shown, the comparison signal 138 is sent to the digitization device 155. The digitization device 155 also receives a clock signal 136 (Clk). Based on the comparison signal 138, the digitization device 155 may determine that the successive approximation is complete. By determining the successive approximation is complete, the existing approximation, e.g., a current estimate, is kept and the existing approximation is sent as the first digitized signal 146 to the subtraction module 130. However, if the comparison signal 138 indicates that the successive approximation is not complete, based on the clock signal 136, the digitization device 155 goes to a next state and generates the next approximation, e.g., the next estimate, at a next iteration, e.g., a next cycle of the clock signal 136, and sends the next approximation via a signal 143 to a DAC 150. The DAC 150 converts the approximation to an analog signal (e.g., signal 148), which is a next estimate. The iterations continue until the comparison signal 138 indicates that the iterations of the successive approximation are complete as indicated above.

As shown in FIG. 1B, as the input signal 125 is continuously sampled and digitized, the output signal 152 is sent to the spectrum detector 165 for generating a spectrum of the output signal 152. In some embodiments, the DAC 140 is included in the DAC 150. In some embodiments, the dither sum value 128 and the signal 143 are time-multiplexed and the result of the multiplexing is fed as input to the DAC 150. An output of the DAC 150 is fed into a time-demultiplexer to generate the signal 148 and the dither sum signal 132.

Figure 1C:
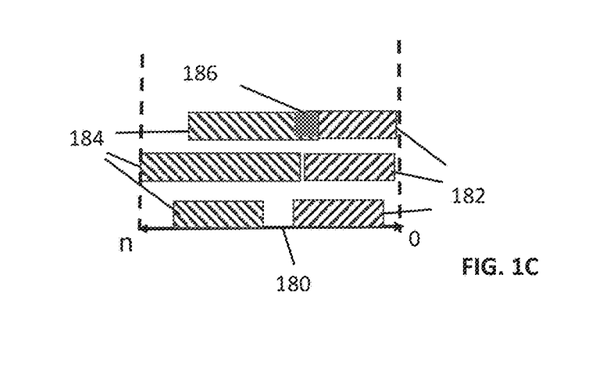
FIG. 1C illustrates a bit range of ADC systems, according to various aspects of the subject technology.

FIG. 1C illustrates a bit range 180 of the ADC system (e.g., ADC systems 100 and 170 shown in FIGS. 1A and 1B, respectively). The bit range 180 which is from bit zero to bit n, which is also the bit range of the ADC module 160 shown in FIG. 1B. In some embodiments, the bit range 180 has 12, 16, 24, or 32 bits and, thus, n is 11, 15, 23, or 31. FIG. 1C shows the LSB segments 182 and the MSB segments 184. In some embodiments, the LSB segment 182 and the MSB segment 184 covers the entirety of the bit range 180. In some embodiments, the LSB segment 182 and the MSB segment 184 overlap in segment 186. In some embodiments, the LSB segment 182 and the MSB segment 184 do not cover the entirety of the bit range 180. In some embodiments, the LSB segments 182 has between 2 to 6 bits. In some embodiments, the MSB segment 184 has between 3 to 6 bits.

Figure 2A:
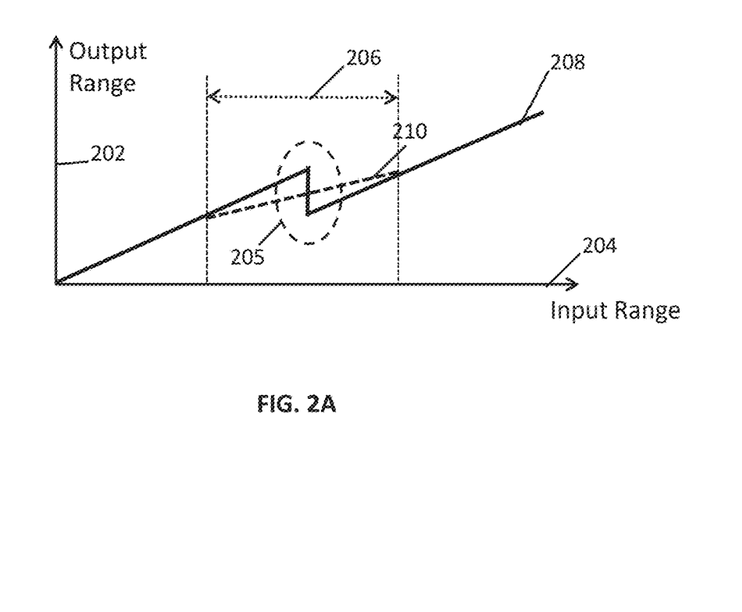
FIGS. 2A and 2B illustrate graphs of input signal range vs. output signal range and show the effects of dithering, according to various aspects of the subject technology.
Figure 2B:
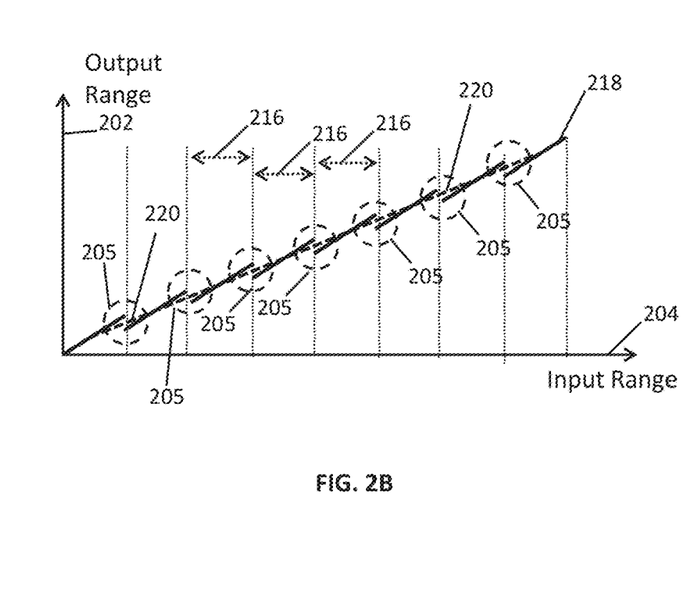

FIGS. 2A and 2B illustrate graphs of input signal range vs. output signal range and show the effects of dithering, according to various aspects of the subject technology. FIGS. 2A and 2B respectively show graphs 208 and 218 on the output range 202 vs. the input range 204. The graphs 208 and 218 show a signal, e.g., voltage, after going through a SAR ADC vs. the signal before a SAR ADC is applied. FIG. 2A shows a discontinuity 205 in a region 206. Also, FIG. 2A shows that by applying dithering in a MSB segment (e.g., MSB segment 184 shown in FIG. 1B), the discontinuity is improved in region 206 to a line 210. FIG. 2B shows discontinuities 205 in multiple regions 216 that periodically repeats. FIG. 2B also shows that by applying dithering in a LSB segment (e.g., LSB segment 182), the discontinuity is improved in regions 216 to a line 220.

Figure 3A:
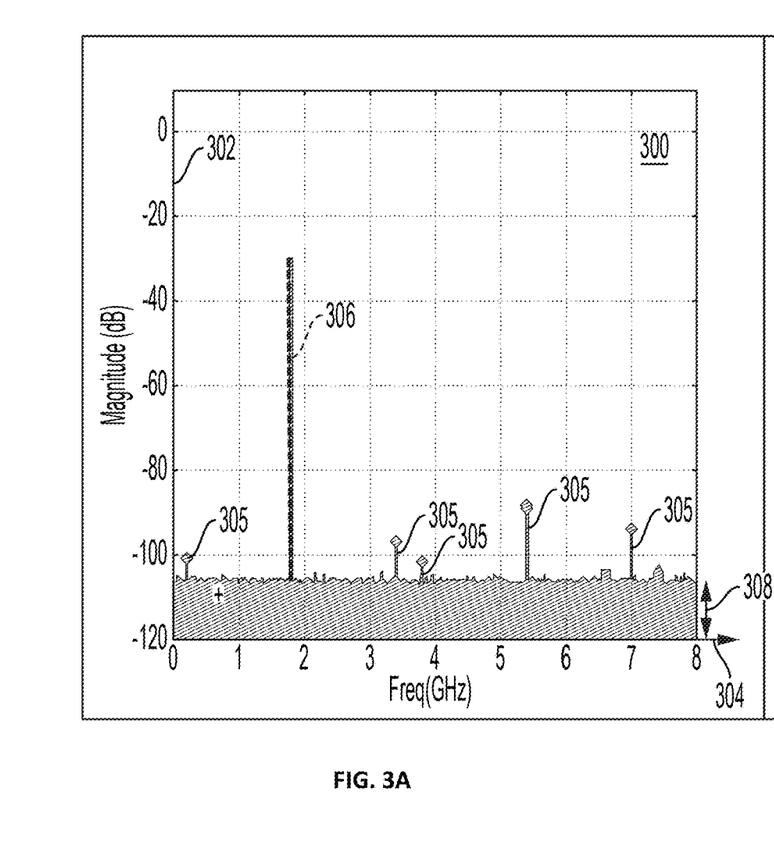
FIGS. 3A, 3B, 3C, 3D illustrate multiple graphs of the spectrum of a digitized signal, according to various aspects of the subject technology.
Figure 3B:
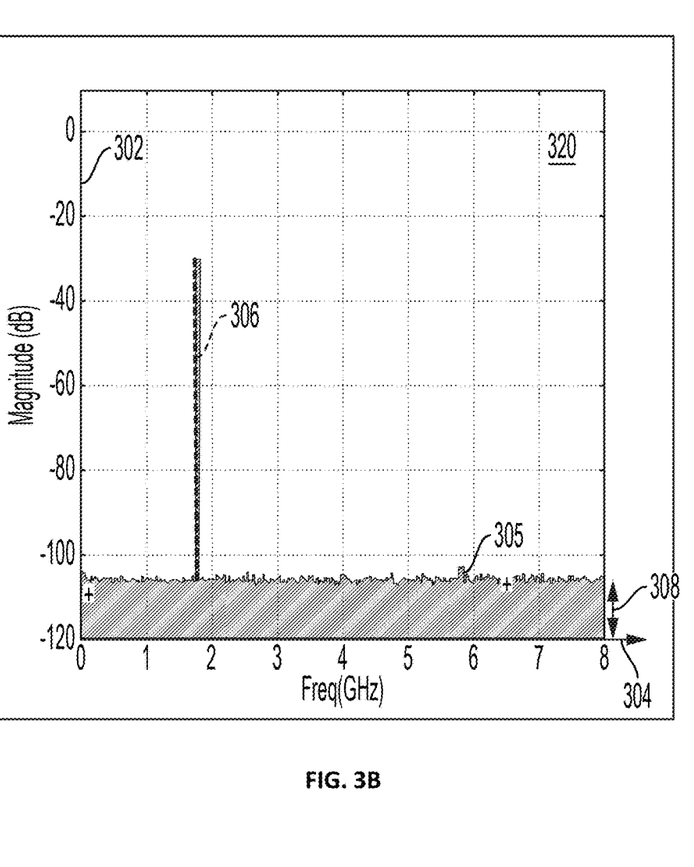
Figure 3C:
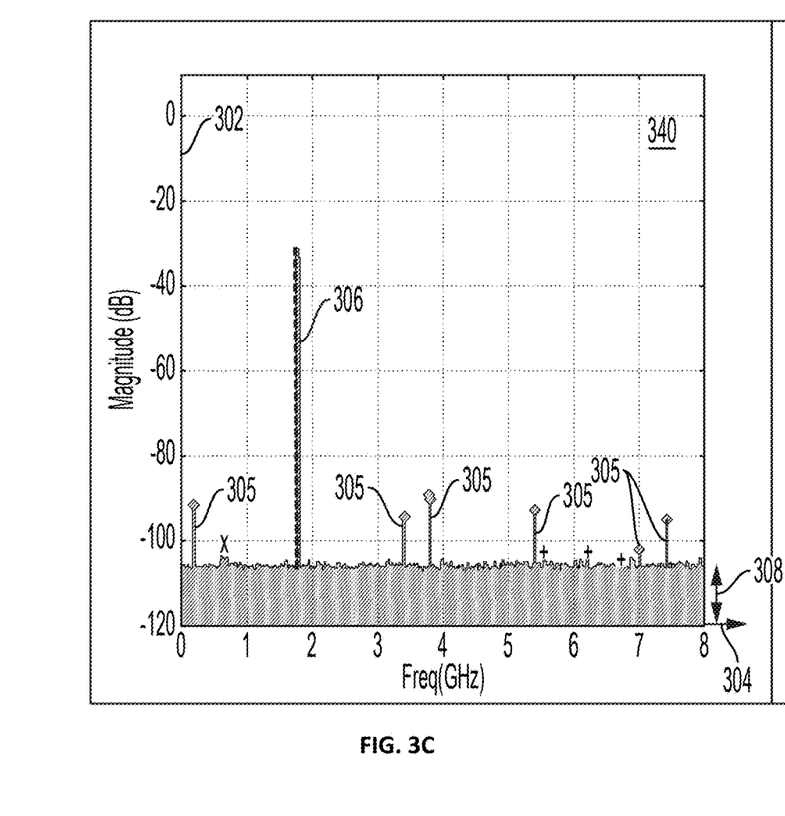
Figure 3D:
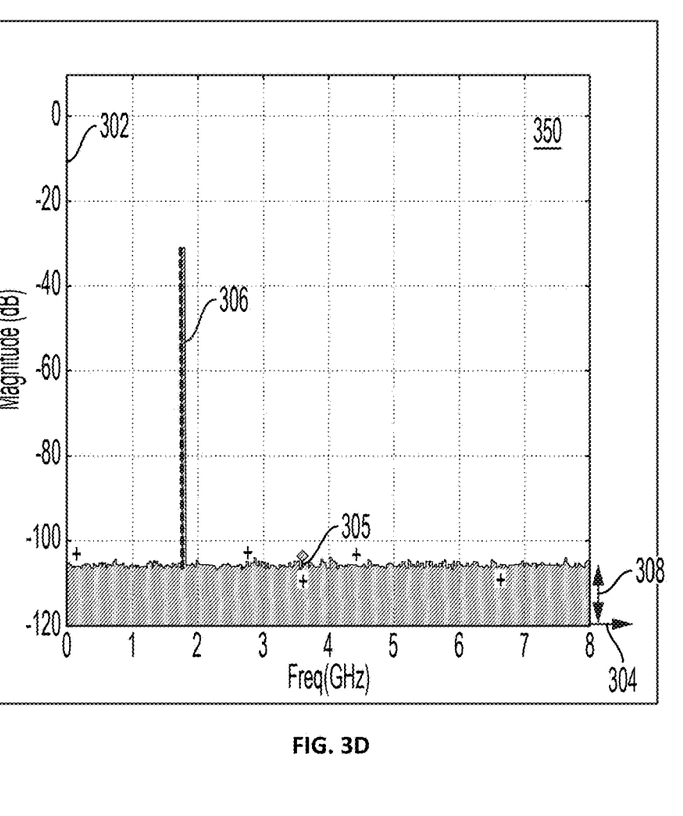

FIGS. 3A, 3B, 3C, 3D illustrate multiple graphs of the spectrum of a digitized signal, according to various aspects of the subject technology. FIGS. 3A, 3B, 3C, 3D show a magnitude of the spectrum in a coordinate 302 vs. a frequency 304 of the spectrum. In some embodiments, a SAR ADC digitizes a signal that includes noise. The signal has a single frequency of 1.8 GHz and the results of the digitization, using different dithering schemes, are displayed in graphs 300, 320, 340, and 350. In each one of the graphs, the single frequency of 1.8 GHz is shown by an input frequency component 306. The graphs 300, 320, 340, and 350 also show a white noise level 308. No dithering is used in FIG. 3A. In FIG. 3B, only 3 bit MSB dither with values −56, −40, −24, −8, +8, +24, +40, +56 are used. As noted, the input frequency component 306 is the original input and all other frequency components, e.g., extra frequency components 305, are caused by distortion. Also, no dithering is used in FIG. 3C. In FIG. 3D, only 3 bit LSB dither with values −14, −10, −6, −2, +2, +6, +10, +14 are used. As shown both MSB dither alone and LSB dither alone have helped to clean the digitized signal, however, in both cases only one of the extra frequency components 305 caused by distortion remains and less than five percent of the energy of the extra frequency components 305 remain.

Figure 4A:
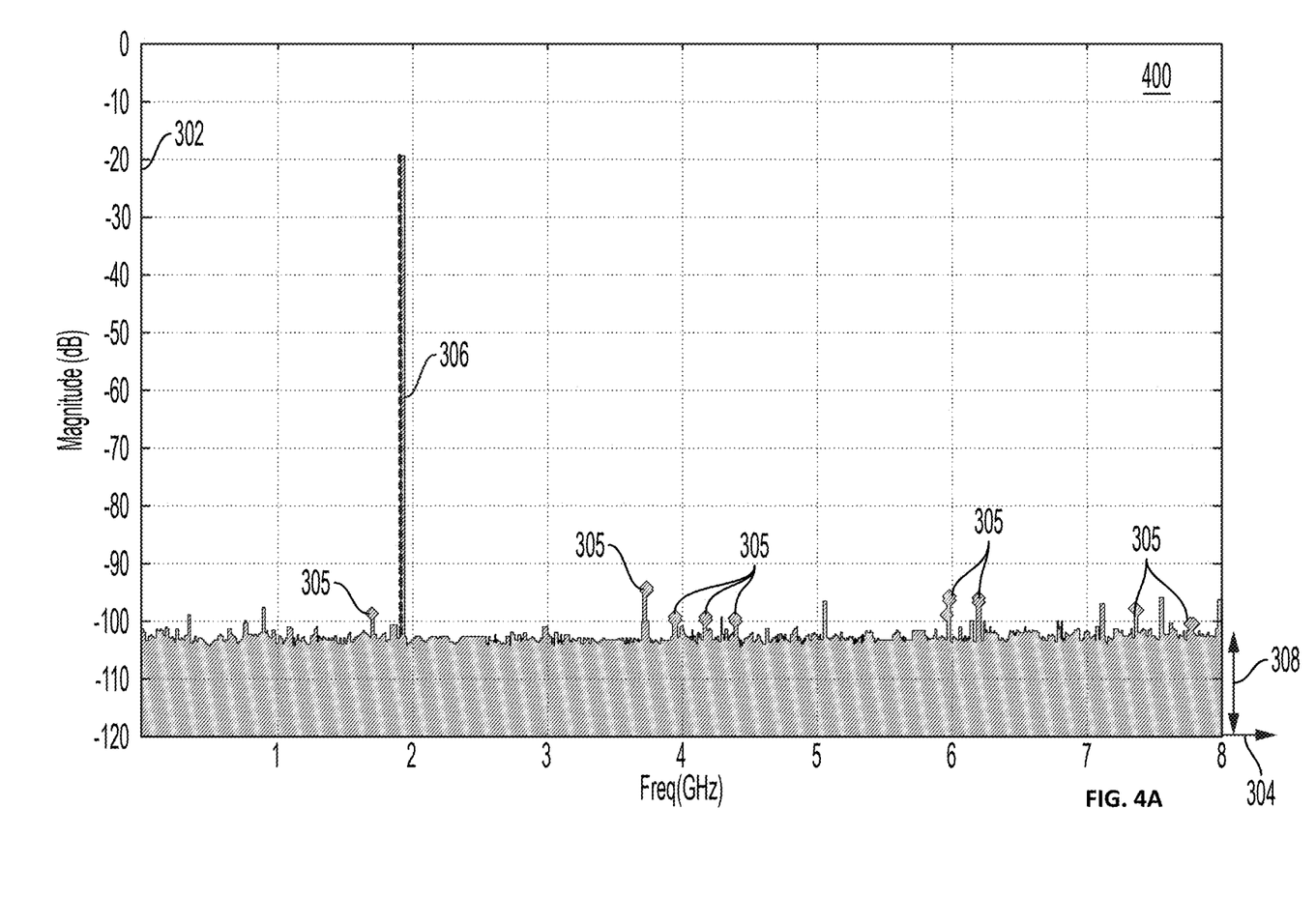
FIGS. 4A, 4B, 4C, 4D illustrate multiple graphs of the spectrum of a digitized signal, according to various aspects of the subject technology.
Figure 4B:
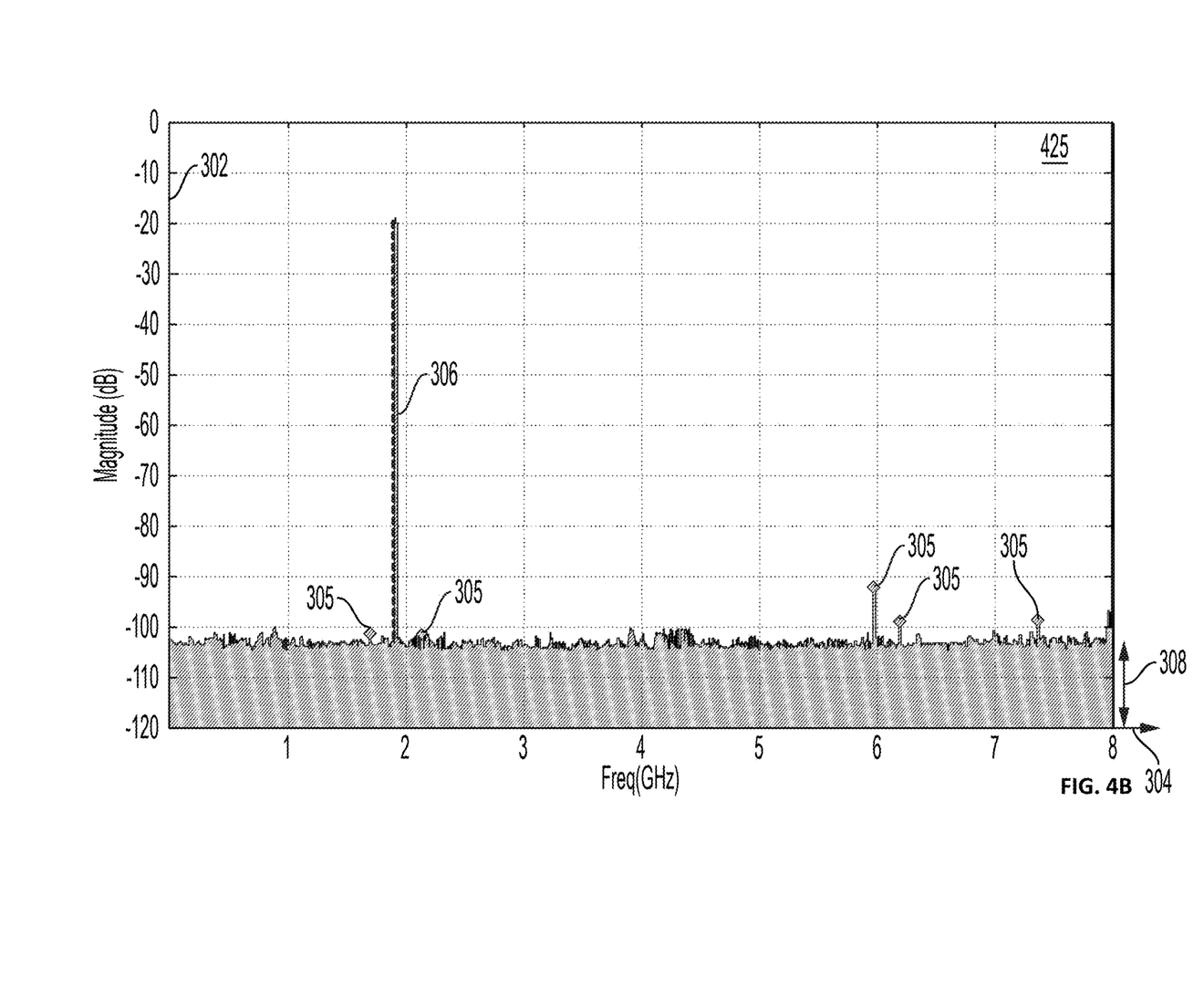
Figure 4C:
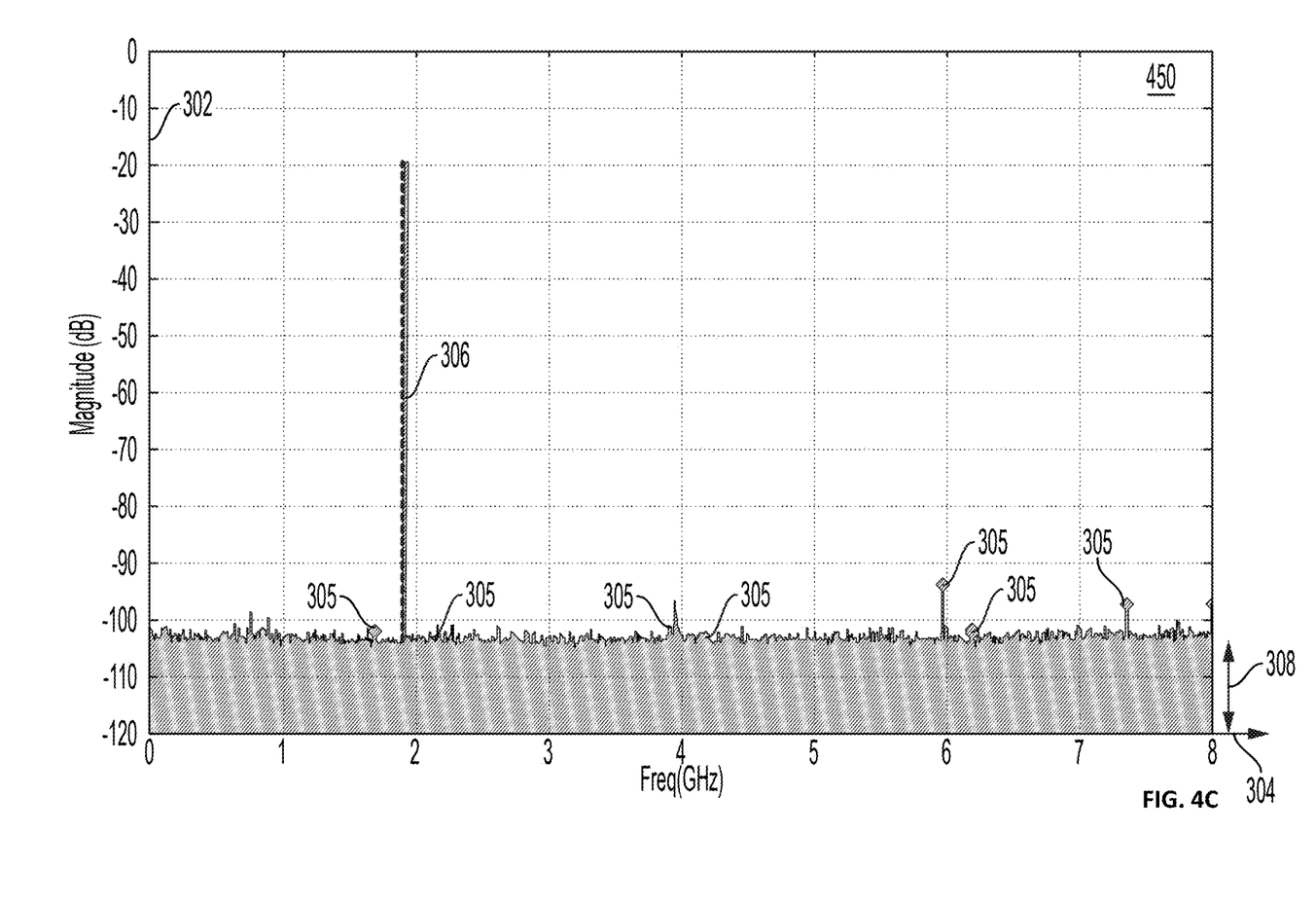
Figure 4D:
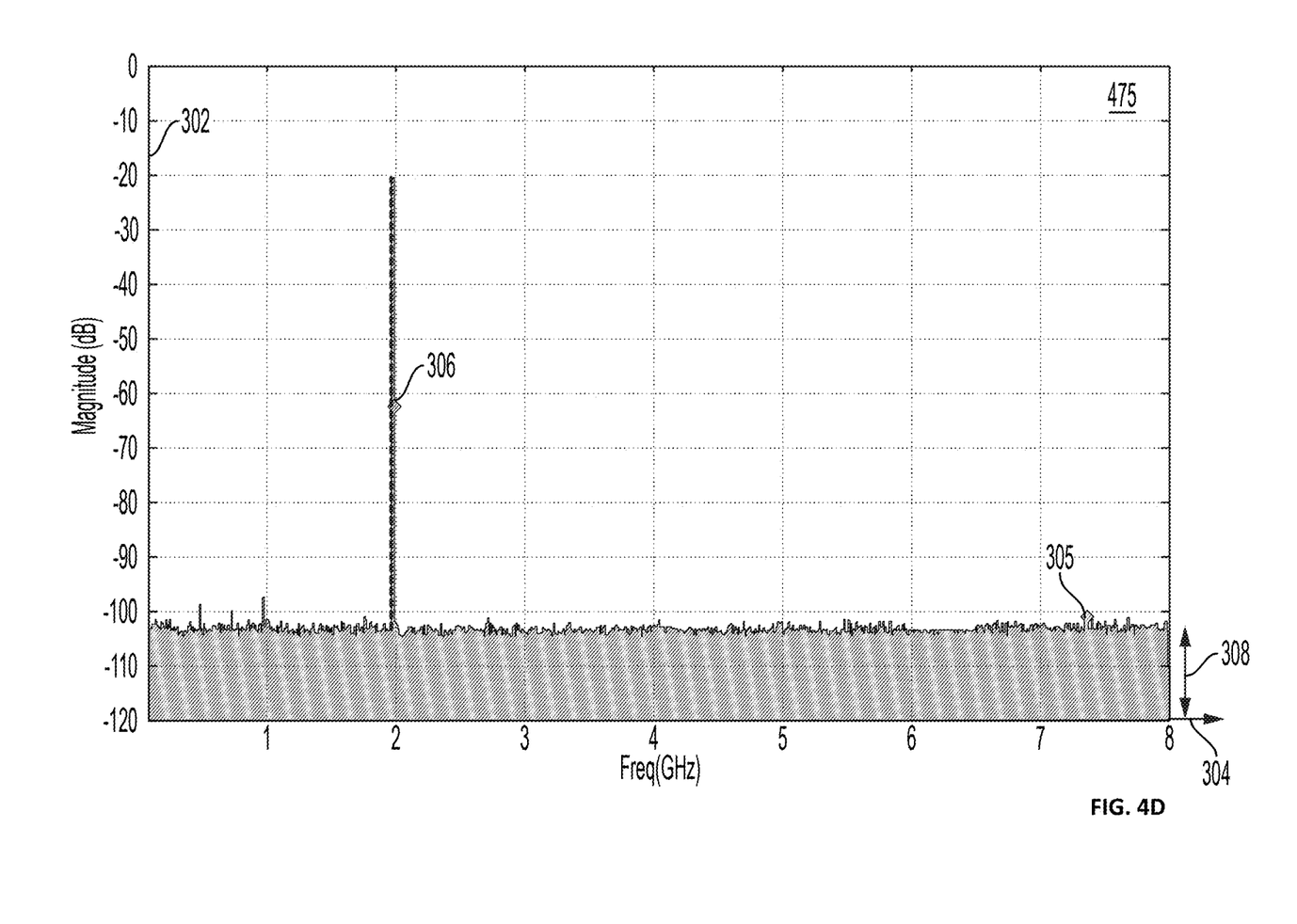

FIGS. 4A, 4B, 4C, 4D illustrate multiple graphs of the spectrum of a digitized signal, according to various aspects of the subject technology. FIGS. 4A, 4B, 4C, 4D show a magnitude of the spectrum in a coordinate 302 vs. a frequency 304 of the spectrum. In some embodiments, a SAR ADC digitizes a signal that includes noise. The signal has a single frequency of 2 GHz and the results of the digitization, using different dithering schemes, are displayed in graphs 400, 425, 450, and 475. In each one of the graphs, the single frequency of 2 GHz is shown by an input frequency component 306. The graphs 400, 425, 450, and 475 also show the white noise level 308. No dithering is used in FIG. 4A. In FIG. 4B, only MSB dither is implemented. As noted, the input frequency component 306 is the original input and all extra frequency components 305 are caused by distortion. As shown in FIG. 4B, more than half of the extra frequency components 305 that are caused by distortion remain. In FIG. 4C, only LSB dither is implemented. Although, FIG. 4C has a slightly smaller number of the extra frequency components 305 compared to FIG. 4B, still about half of the extra frequency components 305 remains. In FIG. 4D, both MSB dither and LSB dither are implemented together. As shown, when using both MSB dither and LSB dither, almost all of the extra frequency components 305 are removed. Thus, by implementing the combination of the MSB dither and LSB dither, less than ten percent of a number of extra frequency components 305 remain and less than five percent of the energy of the extra frequency components 305 remain.

In some embodiments, as shown in FIGS. 3A and 4A, the spectrum of the output signal 152 includes the extra frequency components 305 in addition to an input frequency component 306. In some embodiments, and back to FIG. 1B, based on a ratio of energy of extra frequency components 305 to the energy of the input frequency component 306 being more than a predetermined value, e.g., more than 5 percent, the spectrum detector 165 send a command signal 111 to the controller 102 to change the number of bits of the LSB segment 182 and/or the number of bits of the MSB segment 184 to change the dither sum signal 132 to reduce the energy of extra frequency components 305. In some embodiments, the spectrum detector 165 determines a magnitude and energy of a spectrum of the output signal 152, which is the magnitude of spectrum of the output signal 152 as a function of a frequency of an energy of the spectrum as a function of the frequency.

In some embodiments, the ADC system 170, e.g., the system, is calibrated by applying an input signal 125 having an input frequency in a frequency range such as between 1.0 GHz and 2.0 GHz, for example. The spectrum of the output signal 152 is determined by the spectrum detector 165. The ratio of the energy of extra frequency components 305 to the energy of the input frequency component 306 is determined. If the ratio is not below a limit, the spectrum detector 165 sends the command signal 111 to the controller 102 to change the number of bits of the LSB segment 182 and/or the number of bits of the MSB segment 184. Then, the spectrum detector 165 re-determines the ratio of the energy of extra frequency components 305 to the energy of the input frequency component 306. This step is iteratively repeated until a number of bits of the LSB segment 182 and the MSB segment 184 are determined that produce the ratio that is below the limit, e.g., below 5 percent. In some embodiments, the iterative method is repeated until the number of bits of the LSB segment 182 and the MSB segment 184 are determined that minimizes the ratio of the energy of extra frequency components 305 to the energy of the input frequency component 306. In some embodiments, the iterative method is executed for multiple frequencies, e.g., multiple frequencies in a frequency range, and the optimum number of bits of the LSB segment 182 and the MSB segment 184 are determined for the frequency range.

The subject technology discussed above produces a method of applying one or more dither signals to the input signal of a SAR ADC before the input signal is digitized, e.g., is quantized and the quantized values are converted to digits. The subject technology, by adding the one or more dither signals, reduces non-linearity effects, harmonic spurs, and distortion of the SAR ADC. In addition, the subject technology reduces the mismatch between SAR ADCs when multiple SAR ADCs are used.

According to aspects of the subject technology, a system includes a dither generator module that includes a most significant bits (MSB) dither generator device to generate a first random value and a least significant bits (LSB) dither generator device to generate a second random value. The system includes a first digital to analog converter (DAC) receives the first random value and the second random value and to generate a dither sum signal based on a sum of the first random value and the second random value. The system further includes an analog to digital converter (ADC) that receives a sum of the dither sum signal and a sampled input signal and generates a first digitized signal.

In an aspect of the subject technology, the system further includes a subtraction module to subtract the sum of the first random value and the second random value from the first digitized signal to produce a digitized output signal. In an aspect of the subject technology, the first random value is an integer with a first magnitude that has non-zero bits limited to an MSB segment of a bit range of the first DAC, and the second random value is an integer with a second magnitude that has non-zero bits limited to an LSB segment of the bit range of the first DAC. In an aspect of the subject technology, the MSB dither generator device generates integer random values having non-zero bits in the MSB segment and the LSB dither generator device generates integer random values having non-zero bits in the LSB segment. The MSB segment includes at least an upper half of the bit range, the LSB segment includes at least a lower half of the bit range, and the MSB segment and the LSB segment overlap in at least one bit. In an aspect of the subject technology, the sum of the dither sum signal and the sampled input signal is a modified sampled input signal. The ADC includes a comparator module that receives an initial estimate of the first digitized signal and the modified sampled input signal, compares the initial estimate of the first digitized signal and the modified sampled input signal, and provides a comparison signal. In some embodiments, a non-zero bit is a bit with a value that is not zero, e.g., the bit value is one. The ADC also includes a digitization device coupled to the comparator module that receives the comparison signal and a clock signal and based on the comparison signal, the digitization device performs either that in response to the comparison signal being within a range, keeps a current estimate of the first digitized signal and provides the current estimate of the first digitized signal at a first output of the digitization device, or in response to the comparison signal not being within the range, generates a next estimate of the first digitized signal at a next cycle of the clock signal and provides the next estimate of the first digitized signal at a second output of the digitization device. The ADC also includes a second DAC coupled to the digitization device that receives the next estimate of the first digitized signal from the second output of the digitization device and provides the next estimate of the first digitized signal to the comparator module. Generating the next estimate of the first digitized signal continues until the comparison signal is within the range and the second DAC includes the first DAC. In an aspect of the subject technology, the system further includes a sample and hold (S/H) module that receives an input signal, samples the input signal, and provides the sampled input signal. The system also includes an adder module coupled to the S/H module and coupled to the first DAC. The adder module receives the sampled input signal and the dither sum signal and provides the sum of the dither sum signal and the sampled input signal.

According to aspects of the subject technology, a system includes a digital to analog converter (DAC) having a bit range, an analog to digital converter (ADC), and a dither generator module that includes a most significant bits (MSB) dither generator device to generate a first integer random value with a magnitude having non-zero bits that are limited to a first number of bits in an MSB segment that includes a first portion of an upper half of a bit range, and a least significant bit (LSB) dither generator device to generate a second integer random value with a magnitude having non-zero bits that are limited to a second number of bits in an LSB segment that includes a second portion a lower half of the bit range. The DAC receives the first integer random value and the second integer random value and generates a dither signal based on a sum of the first integer random value and the second integer random value. The ADC receives a sum of the dither signal and a sampled input signal and generates a first digitized signal. The system further includes a subtraction module to subtract the sum of the first integer random value and the second integer random value from the first digitized signal to produce a digitized output signal.

In an aspect of the subject technology, the dither generator module further include an adder module coupled the MSB dither generator device and the LSB dither generator device and to receive the first integer random value and the second integer random value and to generate a third integer random value equal to a sum of the first integer random value and the second integer random value and to provide the third integer random value to the DAC. The dither generator module also includes a first switch coupled between the MSB dither generator device and the adder module, a second switch coupled between the LSB dither generator device and the adder module, and a controller coupled to first switch and the second switch. The controller opens and closes the first switch and the second switch independent of each other such that the third integer random value is equal to either a sum of the first integer random value and the second integer random value when both the first switch and the second switch are closed, the first integer random value when the first switch is closed and the second switch is opened, or the second integer random value when the first switch is opened and the second switch is closed. In an aspect of the subject technology, the sum of the dither signal and the sampled input signal is a modified input signal. The ADC includes a comparator module to receive an initial estimate of the first digitized signal and a modified sampled input signal, compare the initial estimate of the first digitized signal and the modified sampled input signal, and provide a comparison signal. The ADC also includes a digitization device that receives the comparison signal and a clock signal, based on the comparison signal, the digitization device either keeps a current estimate of the first digitized signal and provides the current estimate of the first digitized signal, or generates a next estimate of the first digitized signal at a next cycle of the clock signal, and provides the next estimate of the first digitized signal. The ADC further includes a second DAC coupled to the digitization device to receive the next estimate of the first digitized signal from the digitization device and to provide an analog form of the next estimate of the first digitized signal to the comparator module for a next estimate. In an aspect of the subject technology, the system further includes a sample and hold (S/H) module to receive the input signal, to sample the input signal and hold samples of the input signal, and to provide the samples of the input signal. In an aspect of the subject technology, the comparator module receives the modified sampled input signal via a non-inverting node of the comparator module. In an aspect of the subject technology, the bit range is 12 or 24, the MSB segment includes an upper 7/12 of the bit range and the LSB segment includes a lower half of the bit range. In an aspect of the subject technology, a first number of bits of is 4 and a second number of bits is 4 and the first number of bits and the second number of bits do not overlap. In an aspect of the subject technology, the bit range has either 16, 24, or 32 bits, the MSB segment includes an upper half of the bit range and the LSB segment includes the lower half of the bit range.

According to aspects of the subject technology, a system includes a digital to analog converter (DAC) having a bit range, an analog to digital converter (ADC), and a most significant bits (MSB) dither generator device that generates a first integer random value with a magnitude that has non-zero bits that are limited to an MSB segment of the bit range. The DAC receives the first integer random value and generates a dither signal based on the first integer random value. The ADC receives a sum of the dither signal and a sampled input signal and generates a first digitized signal.

In an aspect of the subject technology, the system further includes a subtraction module that subtracts the first integer random value from the first digitized signal to produce a digitized output signal. In an aspect of the subject technology, the system further includes a spectrum detector coupled to the digitized output signal to generate a spectrum of the digitized output signal. In an aspect of the subject technology, the system further includes a least significant bits (LSB) dither generator device to generate a second integer random value. A magnitude of the second integer random value has non-zero bits that are limited to an LSB segment of the bit range. The DAC generates a dither signal based on a sum of the first integer random value and the second integer random value. In an aspect of the subject technology, the system further includes a subtraction module that subtract a sum of the first integer random value and the second integer random value from the first digitized signal to produce the digitized output signal. In an aspect of the subject technology, the system further includes a subtraction module and an adder module coupled the MSB dither generator device and the LSB dither generator device. An output of the adder module is provided to the DAC to generate the dither signal. The system also includes a first switch coupled between the MSB dither generator device and the adder module and a second switch coupled between the LSB dither generator device and the adder module. The system includes a controller coupled to first switch and the second switch to open and close the first switch and the second switch independent of each other such that the output of the adder module is equal to either: a sum of the first integer random value and the second integer random value when both the first switch and the second switch are closed, the first integer random value when the first switch is closed and the second switch is opened, or the second integer random value when the first switch is opened and the second switch is closed. The subtraction module subtracts the output of the adder module from the first digitized signal to produce the digitized output signal.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multi-tasking and parallel processing may be advantageous. Moreover, the separation of various system components in the embodiments described above should not be understood as requiring such separation in all embodiments, and it should be understood that the described program components and systems could generally be integrated together in a single hardware or software product, or packaged into multiple hardware or software products.

As used in this specification and any claims of this application, the terms "base station," "receiver," "computer," "server," "processor," "memory," "module," "controller," "adder," "subtractor," "converter," "generator," and "comparator" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A system, comprising:
    a dither generator module comprising:
        a most significant bits (MSB) dither generator device configured to generate a first random value;
        a least significant bits (LSB) dither generator device configured to generate a second random value; and
        a first digital to analog converter (DAC) configured to receive the first random value and the second random value and to generate a dither sum signal based on a sum of the first random value and the second random value; and
    an analog to digital converter (ADC) configured to receive a sum of the dither sum signal and a sampled input signal and generate a first digitized signal.

2. The system of claim 1, further comprising:
    a subtraction module configured to subtract the sum of the first random value and the second random value from the first digitized signal to produce a digitized output signal.

3. The system of claim 1, the first random value is an integer with a first magnitude that has non-zero bits limited to an MSB segment of a bit range of the first DAC, and wherein the second random value is an integer with a second magnitude that has non-zero bits limited to an LSB segment of the bit range of the first DAC.

4. The system of claim 3, wherein the MSB dither generator device is configured to generate integer random values having non-zero bits in the MSB segment and the LSB dither generator device is configured to generate integer random values having non-zero bits in the LSB segment, wherein the MSB segment comprises at least an upper half of the bit range and the LSB segment comprises at least a lower half of the bit range, and wherein the MSB segment and the LSB segment overlap in at least one bit.

5. The system of claim 1, wherein the sum of the dither sum signal and the sampled input signal is a modified sampled input signal, and wherein the ADC comprises:
    a comparator module configured to receive an initial estimate of the first digitized signal and the modified sampled input signal, compare the initial estimate of the first digitized signal and the modified sampled input signal, and provide a comparison signal;
    a digitization device coupled to the comparator module and configured to receive the comparison signal and a clock signal, wherein, based on the comparison signal, the digitization device is configured either to:
        in response to the comparison signal being within a range, keep a current estimate of the first digitized signal and provide the current estimate of the first digitized signal at a first output of the digitization device, or
        in response to the comparison signal not being within the range, generate a next estimate of the first digitized signal at a next cycle of the clock signal, and provide the next estimate of the first digitized signal at a second output of the digitization device; and
    a second DAC coupled to the digitization device and configured to receive the next estimate of the first digitized signal from the second output of the digitization device and to provide the next estimate of the first digitized signal to the comparator module, wherein generating the next estimate of the first digitized signal continues until the comparison signal is within the range, and wherein the second DAC comprises the first DAC.

6. The system of claim 1, further comprising:
    a sample and hold (S/H) module configured to receive an input signal, to sample the input signal, and to provide the sampled input signal; and
    an adder module coupled to the S/H module and coupled to the first DAC, wherein the adder module is configured to receive the sampled input signal and the dither sum signal and to provide the sum of the dither sum signal and the sampled input signal.

7. A system, comprising:
a first digital to analog converter (DAC) having a bit range;
an analog to digital converter (ADC);
a dither generator module that comprises:
 a most significant bits (MSB) dither generator device configured to generate a first integer random value with a magnitude having non-zero bits that are limited to a first number of bits in an MSB segment that comprises a first portion of an upper half of the bit range; and
 a least significant bit (LSB) dither generator device configured to generate a second integer random value with a magnitude having non-zero bits that are limited to a second number of bits in an LSB segment that comprises a second portion of a lower half of the bit range, wherein:
  the first DAC is configured to receive the first integer random value and the second integer random value and to generate a dither signal based on a sum of the first integer random value and the second integer random value; and
  the ADC is configured to receive a sum of the dither signal and a sampled input signal and generate a first digitized signal; and
a subtraction module configured to subtract the sum of the first integer random value and the second integer random value from the first digitized signal to produce a digitized output signal.

8. The system of claim 7, wherein the dither generator module further comprises:
an adder module coupled the MSB dither generator device and the LSB dither generator device and configured to receive the first integer random value and the second integer random value and to generate a third integer random value equal to a sum of the first integer random value and the second integer random value and to provide the third integer random value to the first DAC;
a first switch coupled between the MSB dither generator device and the adder module;
a second switch coupled between the LSB dither generator device and the adder module; and
a controller coupled to first switch and the second switch, wherein the controller is configured to open and close the first switch and the second switch independent of each other such that the third integer random value is equal to either:
 a sum of the first integer random value and the second integer random value when both the first switch and the second switch are closed,
 the first integer random value when the first switch is closed and the second switch is opened, or
 the second integer random value when the first switch is opened and the second switch is closed.

9. The system of claim 7, wherein the sum of the dither signal and the sampled input signal is a modified sampled input signal, and wherein the ADC comprises:
a comparator module configured to receive an initial estimate of the first digitized signal and a modified sampled input signal, compare the initial estimate of the first digitized signal and the modified sampled input signal, and provide a comparison signal;
a digitization device configured to receive the comparison signal and a clock signal, wherein, based on the comparison signal, the digitization device is configured either to:
 keep a current estimate of the first digitized signal and provide the current estimate of the first digitized signal, or
 generate a next estimate of the first digitized signal at a next cycle of the clock signal, and provide the next estimate of the first digitized signal; and
a second DAC coupled to the digitization device and configured to receive the next estimate of the first digitized signal from the digitization device and to provide an analog form of the next estimate of the first digitized signal to the comparator module for a next estimate.

10. The system of claim 9, further comprising:
a sample and hold (S/H) module configured to receive an input signal, to sample the input signal and hold samples of the input signal, and to provide the samples of the input signal.

11. The system of claim 10, wherein the comparator module is configured to receive the modified sampled input signal via a non-inverting node of the comparator module.

12. The system of claim 7, wherein the bit range is 12 or 24, the MSB segment comprises an upper 7/12 of the bit range and the LSB segment comprises a lower half of the bit range.

13. The system of claim 7, wherein a first number of bits is 4 and the second number of bits is 4, and wherein the first number of bits and the second number of bits do not overlap.

14. The system of claim 7, wherein the bit range has either 16, 24, or 32 bits, the MSB segment comprises an upper half of the bit range and the LSB segment comprises the lower half of the bit range.

15. A system, comprising:
a digital to analog converter (DAC) having a bit range;
an analog to digital converter (ADC);
a most significant bits (MSB) dither generator device configured to generate a first integer random value, wherein a magnitude of the first integer random value has non-zero bits that are limited to an MSB segment of the bit range, wherein:
 the DAC is configured to receive the first integer random value and to generate a dither signal based on the first integer random value; and
 the ADC is configured to receive a sum of the dither signal and a sampled input signal and generate a first digitized signal.

16. The system of claim 15, further comprising:
a subtraction module configured to subtract the first integer random value from the first digitized signal to produce a digitized output signal.

17. The system of claim 16, further comprising:
a spectrum detector coupled to the digitized output signal and configured to generate a spectrum of the digitized output signal.

18. The system of claim 15, further comprising:
a least significant bits (LSB) dither generator device configured to generate a second integer random value, wherein a magnitude of the second integer random value has non-zero bits that are limited to an LSB segment of the bit range; and
the DAC is configured to generate a dither signal based on a sum of the first integer random value and the second integer random value.

19. The system of claim 18, further comprising:
a subtraction module configured to subtract a sum of the first integer random value and the second integer random value from the first digitized signal to produce a digitized output signal.

20. The system of claim 18, further comprising:
a subtraction module;
an adder module coupled the MSB dither generator device and the LSB dither generator device, wherein an output of the adder module is provided to the DAC to generate the dither signal;
a first switch coupled between the MSB dither generator device and the adder module;
a second switch coupled between the LSB dither generator device and the adder module; and
a controller coupled to first switch and the second switch, wherein the controller is configured to open and close the first switch and the second switch independent of each other such that the output of the adder module is equal to either:
 a sum of the first integer random value and the second integer random value when both the first switch and the second switch are closed,
 the first integer random value when the first switch is closed and the second switch is opened, or
 the second integer random value when the first switch is opened and the second switch is closed; and
the subtraction module is configured to subtract the output of the adder module from the first digitized signal to produce a digitized output signal.

* * * * *